United States Patent [19]
Furuhata

[11] Patent Number: 5,315,150
[45] Date of Patent: May 24, 1994

[54] SEMICONDUCTOR DEVICE AND METHOD OF MANUFACTURING THE SAME

[75] Inventor: Tomoyuki Furuhata, Suwa, Japan

[73] Assignee: Seiko Epson Corporation, Tokyo, Japan

[21] Appl. No.: 797,919

[22] Filed: Nov. 26, 1991

[30] Foreign Application Priority Data

Nov. 28, 1990 [JP] Japan .................. 2-328095
Nov. 28, 1990 [JP] Japan .................. 2-328096
May 27, 1991 [JP] Japan .................. 3-120958
May 27, 1991 [JP] Japan .................. 3-120959

[51] Int. Cl.$^5$ .................. H01L 23/48; H01L 21/22
[52] U.S. Cl. .................. 257/588; 257/378; 257/382; 257/384; 257/740; 257/768; 257/773; 437/141; 437/162; 437/192; 437/203
[58] Field of Search .............. 357/23.4, 43; 257/378, 257/382, 384, 588, 740, 768, 773; 437/141, 162, 192, 203

[56] References Cited

U.S. PATENT DOCUMENTS

| | | | |
|---|---|---|---|
| 4,433,468 | 2/1984 | Kawamata | 257/382 |
| 5,045,901 | 9/1991 | Komori et al. | 357/23.4 |
| 5,079,607 | 1/1992 | Sakurai | 357/23.4 |

FOREIGN PATENT DOCUMENTS

| | | |
|---|---|---|
| 0200603 | 11/1986 | European Pat. Off. . |
| 0328819 | 8/1989 | European Pat. Off. . |
| 60-219771 | 11/1985 | Japan . |
| 61-13668 | 1/1986 | Japan . |
| 7611774 | 2/1978 | Netherlands . |
| 2075255 | 11/1981 | United Kingdom . |

Primary Examiner—Edward Wojciechowicz
Attorney, Agent, or Firm—Oliff & Berridge

[57] ABSTRACT

A semiconductor device including a MOS element having a buried contact structure. The buried contact structure includes a first contact diffused region formed by diffusion from a polycrystalline silicon layer and a second contact diffused region formed by diffusion deeper than the first contact diffused region, so that a parasitic resistance of the MOS element can be reduced. In a composite element composed of the MOS element and a bipolar element, partly since the first contact diffused region and an emitter diffused region of the bipolar element can be formed simultaneously, and partly since the depth of connection of the emitter diffused region, with the parasitic resistance of the MOS element being reduced, it is possible to realize a high-speed operation.

20 Claims, 7 Drawing Sheets

SEMICONDUCTOR DEVICE AND METHOD OF MANUFACTURING THE SAME

BACKGROUND OF THE INVENTION

1. Field of the Invention:

This invention relates to a semiconductor device, and more particularly to a semiconductor device including a MOS element, such as a semiconductor device (hereinafter called "Bi-MOS element") in which both a bipolar element and a MOS element are formed on a MOS field effect transistor (hereinafter called "MOSFET") or a single semiconductor substrate and a method of manufacturing such semiconductor device.

2. Description of the Related Art:

As advances have recently been made in integrating elements in a large scale in MOS semiconductor IC devices, application of a buried contact structure is on the rise.

In a typical buried contact structure in conventional MOSFETs, a gate electrode and a source electrode and/or a drain electrode (hereinafter called "source/drain electrode") are formed during the growth and process of one and the same polycrystalline silicon, and a contact with a source diffused region or a drain diffused region (hereinafter called "source/drain diffused region") is formed via a contact diffused region by impurity diffusion from the source/drain electrode.

In response to the minute elements, an LDD (Lightly Doped Drain) structure as a measure against the hot electron problem was used in MOSFET.

Figure 2:
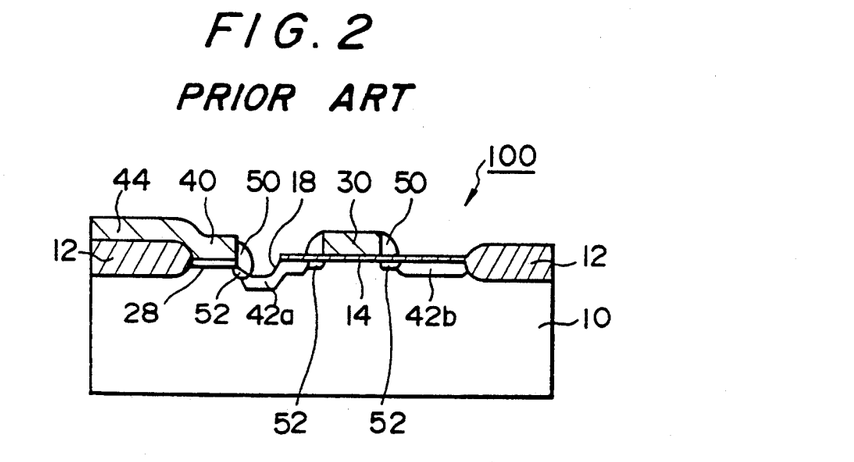
FIG. 2 is a cross-sectional view schematically showing a conventional MOS-type semiconductor device.

The structure of this type semiconductor device is schematically shown in FIG. 2 of the accompanying drawings.

In FIG. 2, MOSFET is an n-channel MOS transistor having an LDD structure. This MOSFET 100 has a buried contact structure on a p-type silicon substrate 10. A contact diffused region 28 constituting this buried contact structure is formed of an n+ diffusion layer formed by impurity diffusion from a source/drain electrode 40 formed of an n+-type polycrystalline silicon layer. The source/drain electrode 40 is formed together with a wiring portion 44 while the layer of a gate electrode 30 is formed. The n+-type contact diffused region 28 is connected to one n+-type source/drain diffused region 42a via an n−-type offset region 52 which is located right under a side wall 50 contiguous to the source/drain electrode 40.

In FIG. 2, reference numeral 12 designates a field oxide film; 14, a gate oxide film; and 18, a silicon layer hollow formed during etching the polycrystalline silicon layer.

However, the semiconductor device of FIG. 2 has the following problems resulting from the buried contact structure:

(1) If an impurity having a small diffusion constant is used as the impurity in the source/drain electrode 40 of the n+-type polycrystalline silicon, the connection of the n+-type contact diffused region 28 would be shallow. The connection of the n−-type offset region 52 to be connected to the n+-type contact diffused region 28 is originally shallow and has a high resistance. Therefore, the resistance of the whole buried contact structure would increase to add a high parasitic resistance to the source/drain diffused region 42a of MOSFET, thus impairing the mutual conductance of MOSFET and the characteristic of the on current adapted to flow when the transistor is in on state.

(2) During formation of the n+-type gate electrode 30 and the n+-type source/drain electrode 40 by etching, the exposed portion of the p-type silicon substrate 10 also would be etched to form the silicon layer hollow 18. If the n−-type offset region 52 is formed by ion implantation, the impurity would hardly be doped to the peripheral portion of the silicon layer hollow 18 so that the impurity concentration of the n−-type offset region 52 to be formed tends to become lower than a predetermined value while the resistance of the same n−-type offset region 52 tends to become increased. As a result, the function of the LDD structure would work inadequately and thereby cause the above problem (1). This also results in irregularity of the above-mentioned characteristic due to non-uniform processing, such as in the etching step.

The foregoing problems are remarkable if arsenic having a small diffusion constant is used as the impurity in the n+-type polycrystalline silicon layer (source/drain electrode 40), the n−-type offset region 52 and the n+-type source/drain diffused regions 42a, 42b.

Further, for the same reason, the above problem (1) will be caused even in the case of MOSFET having a buried contact structure to which an LDD structure is not added.

Also in the case of a Bi-MOS element, when forming an n+-type emitter diffused region of the bipolar transistor, the same problem as with the MOSFET would occur due to the impurity diffusion of arsenic from the n+-type polycrystalline silicon layer.

In order to realize a high-speed bipolar transistor, the connection of the n+-type emitter diffused region should be shallow. Therefore, when forming a contact diffused region of MOSFET simultaneously with the emitter diffused region, the connection of the contact diffused region would be shallow and thereby cause the above problems (1) and (2). Consequently, if in a Bi-MOS element a parasitic resistance resulting from the buried contact structure is to be reduced, the connection of the diffused region should be deep. This would be an obstacle to a high-speed Bi-MOS element.

SUMMARY OF THE INVENTION

It is therefore an object of this invention to provide a semiconductor device which hardly receives influence of non-uniform processing such as in the etching step, is stable in characteristic and has a low-resistance buried contact structure.

Another object of the invention is to provide a method of manufacturing the above-mentioned semiconductor device.

According to a first aspect of the invention, there is provided a MOS-type semiconductor device comprising:

(a) a semiconductor substrate;

(b) an MOS element formed on a main surface of said semiconductor substrate and having a buried contact structure; and (c) said buried contact structure including at least a first contact diffused region formed by diffusion from a polycrystalline silicon layer, and a second diffused region formed by diffusion deeper than said first contact diffused region.

According to a second aspect of the invention, there is provided a Bi-MOS-type semiconductor device comprising:

(a) a semiconductor substrate;

(b) a bipolar element formed on a main surface of said semiconductor substrate;

(c) an MOS element formed on the main surface of said semiconductor substrate and having a buried contact structure;

(d) an emitter electrode of said bipolar element and a source/drain electrode of said MOS element being in the form of a single polycrystalline silicon layer;

(e) said buried contact structure of said MOS element including at least a first contact diffused region formed by impurity diffusion from said polycrystalline silicon layer and a second contact diffused region formed by diffusion deeper than said first contact diffused region; and (f) an emitter diffused region of said bipolar element and said first contact diffused region being formed by impurity diffusion from said polycrystalline silicon layer.

According to a third aspect of the invention, there is provided a method of manufacturing a MOS-type semiconductor device, comprising the steps of:

(a) forming a second contact diffused region by forming a field oxide film and a gate oxide film on a silicon substrate and then doping an impurity of a large diffusion constant to a buried contact structure forming region;

(b) forming a first contact diffused region by forming openings in the gate oxide film, forming a polycrystalline silicon layer on the silicon substrate and then doping an impurity of a small diffusion constant to the buried contact structure forming region via the openings;

(c) etching the polycrystalline silicon layer to form a gate electrode and a source/drain electrode; and (d) doping an impurity to form a source/drain diffused region.

According to a fourth aspect of the invention, there is provided a method of manufacturing a Bi-MOS-type semiconductor device, comprising the steps of:

(a) forming a second contact diffused region and a collector diffused region by forming a well and then a field oxide film and a gate oxide film on a silicon substrate and then doping an impurity of a large diffusion constant to a buried contact structure forming region and a collector diffused region forming region;

(b) forming a first contact diffused region and an emitter diffused region by doping impurity, with the MOS element forming region masked, to form a base diffused region to a bipolar element, then by forming openings in a gate oxide film of the buried contact structure forming region and an emitter diffused region forming region, by forming a polycrystalline silicon layer on the silicon substrate, with the MOS element forming region unmasked, and by doping an impurity of a small diffusion constant via the openings;

(c) etching the polycrystalline silicon layer to form a gate electrode and a source/drain electrode of the MOS element and an emitter electrode of the bipolar element; and (d) doping an impurity, with a bipolar element forming region masked, to form a source/drain diffused region.

With this semiconductor device, since the diffused region forming the buried contact structure of the MOS element includes the first contact diffused region formed by impurity diffusion from the polycrystalline silicon layer and the second contact diffused region formed by diffusion deeper than the first contact diffused region, it is possible to realize a semiconductor device which hardly receives influence of non-uniform processing such as in the etching step, is stable in characteristic, has a low-resistance buried contact structure and has a low-parasitic resistance.

Further, since the MOS element of this invention has a deep diffusion layer to increase the area of connection of the source/drain, it is suitable for use in, for example, a static random access memory (SRAM). As advances have recently been made in integrating elements, demands for shallow connection of the source/drain of a transistor are on the rise, for which the area of such connection must be reduced. Thus the amount of connection of the source/drain would be reduced so that the amount of connection of storage node in a SRAM using this MOS element will become inadequate, i.e., in SRAM, characteristics such as resistance against noise, leak current and a ray soft error would be insufficient. This problem would be particularly remarkable on the side of the drain. However, if an n-channel transistor in which the MOS element of the invention is incorporated is used, it is possible to increase the area of connection of the source/drain and hence the amount of connection, with the connection of the source/drain near the channel of the transistor being kept shallow, thereby eliminating the foregoing problems.

In addition, since the depth of connection and the impurity concentration of the second contact diffused region constituting the buried contact structure can be set independently of the impurity concentration in the polycrystalline silicon layer, it is possible to improve the degree of freedom of the design of the device.

If this MOS element is combined with a bipolar element, it is possible not only to achieve a highspeed operation of the bipolar element but also to realize a Bi-MOS element having a small parasitic resistance.

The foregoing semiconductor devices can be manufactured in the same number of steps of production as conventional semiconductor devices.

DETAILED DESCRIPTION

Typical embodiments of this invention will now be described with reference to the accompanying drawings.

EMBODIMENT 1

Figure 1:
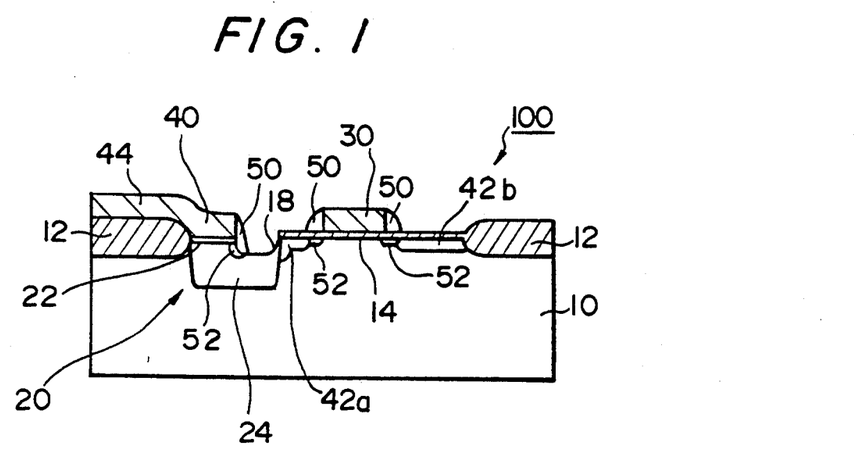
FIG. 1 is a cross-sectional view schematically showing a MOS-type semiconductor device according to a first embodiment of this invention.

FIG. 1 shows a semiconductor device schematically according to a first embodiment of this invention.

Like reference numerals designate similar parts or elements throughout FIGS. 1 and 2.

This semiconductor device comprises an n-channel MOSFET 100 having an LDD structure. In the MOSFET 100, a field oxide film 12 and a gate oxide film 14 are formed on a p-type silicon substrate 10. On the gate oxide film 14, a gate electrode 30 is formed, and a source/drain electrode 40 is formed at a position spaced from the gate electrode 30, and a wiring portion 44 is formed contiguously to the source/drain electrode 40. On the opposite sides of the gate electrode 30 and the end of the source/drain electrode 40, side walls 50 each in the form of a silicon oxide film are formed. Under each of the side walls 50, an $n^-$-type offset region 52 constituting an LDD structure is formed.

In the silicon substrate 10, $n^+$-type source/drain diffused regions 42a, 42b are formed on the opposite sides of the gate electrode 30. In this embodiment, one $n^+$-type source/drain diffused region 42a is connected with the source/drain electrode 40 by a buried contact structure 20.

The buried contact structure 20 includes a first $n^+$-type contact diffused region 22 formed shallowly on the surface of the silicon substrate 10, and a second $n^+$-type contact diffused region 24 formed on the surface of the silicon substrate 10 more deeply than the first $n^+$-type contact diffused region 22.

The second $n^+$-type contact diffused region 24 is formed by previous diffusion of phosphorous of a large diffusion constant as an impurity into the silicon substrate 10, with a part of the second $n^+$-type contact diffused region 24 being connected to the source/drain diffused region 42a. The first $n^+$-type contact diffused region 22 is formed by impurity diffusion of arsenic of a small diffusion contact from the source/drain electrode 40. The depth of the second $n^+$-type contact diffused region 24 should be adequately large so that the contact resistance of the buried contact structure 20 can be reduced lower than a predetermined value. For example, the first $n^+$-type contact diffused region 22 may have a depth of diffusion of 0.1 to 0.3 μm, and the second $n^+$-type contact diffused region 24 may have a depth of diffusion of 0.5 to 0.8 μm.

In the arrangement, the diffused region forming the buried contact structure 20 includes the first $n^+$-type contact diffused region 22 formed by impurity diffusion of arsenic, and the second $n^+$-type contact diffused region 24 formed by impurity diffusion of phosphorous deeper than the first contact diffused region 22. Because of this double-layer structure, it is possible to reduce the buried contact resistance to an adequately small value, realizing a MOSFET having a small parasitic resistance. An increased buried contact resistance causes the above-described problems in the conventional arrangement.

Further, having the second $n^+$-type contact diffused region 24 deep in connection, the MOSFET 100 allows the connecting area of the $n^+$-type source/drain diffused region 42a to increase so that with the connection of the $n^+$-type source/drain diffused region 42a, 42b near the channel being kept shallow, adequate connection capacitance can be secured. Therefore the MOSFET 100 is suitable for use as a static random acess memory (SRAM).

Since the connection of the second $n^+$-type contact diffused region 24 is set to be deeper than the connection of the first $n^+$-type contact diffused region 22, it is possible to obtain a stable low-resistance buried contact structure with no influence from the non-uniform processing, such as irregular depth of etching of the silicon substrate 10.

Further, since the depth of connection and the impurity concentration of the second $n^+$-type contact diffused region 24 can be set independently of the impurity concentration in the polycrystalline silicon layer, it is possible to improve the degree of freedom of the design of the device.

In this embodiment, the buried contact structure is formed only for one source/drain electrode. Alternatively, the buried contact structure may be formed for both the source and drain electrodes.

FIGS. 4A through 4G shows the manufacturing process of the semiconductor device of FIG. 1. Like reference numerals designate similar parts or elements throughout FIGS. 1 and 4.

Figure 4A:
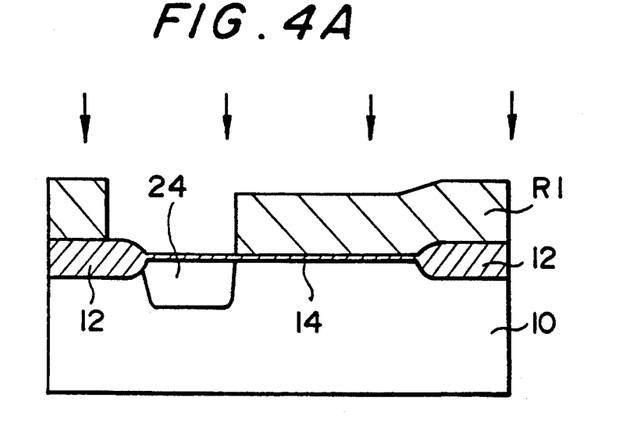
FIGS. 4A through 4G are cross-sectional views showing the manufacturing process of the semiconductor device of FIG. 1.

(A) In the step shown in FIG. 4A, a field oxide film 12 and a gate oxide film 14 are formed on a p-type silicon substrate 10 in the usual method. Then, using a resist film R1 as a mask, ion implantation (indicated by arrows in FIG. 4A) of phosphorous is made in the region defining a buried contact structure 20, under such a condition that energy of implantation is 80 to 120 KeV and an amount of implantation is about $5 \times 10^{13}$ to $5 \times 10^{14}$ cm$^{-2}$. After removing the resist film R1, annealing is performed in the atmosphere of nitrogen at 900° to 1,000° C. for 40 to 80 minutes. In this step, a second $n^+$-type contact diffused region 24 is formed.

Figure 4B:
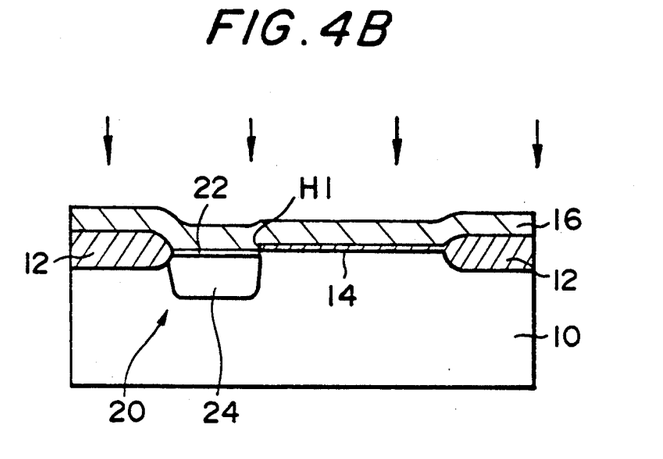

(B) In the step shown in FIG. 4B, opening H1 is formed in the gate oxide film 14 of the region defining the buried contact structure 20, and then a polycrystalline silicon layer 16 having a thickness of about 2,000 to 5,000 Angstrom is piled on the silicon substrate 10. Then, under such a condition that energy of implantation is 60 to 100 KeV and an amount of implantation is $5 \times 10^{15}$ to $1 \times 10^{16}$ cm$^{-2}$, ion implantation (indicated by arrows in the drawing) of arsenic is performed, and annealing is performed in the atmosphere of nitrogen at 900° to 1,000° C. for 20 to 30 minutes. In this step, an $n^+$-type contact diffused region 22 is formed by impurity diffusion of arsenic from the polycrystalline silicon layer 16.

Figure 4C:
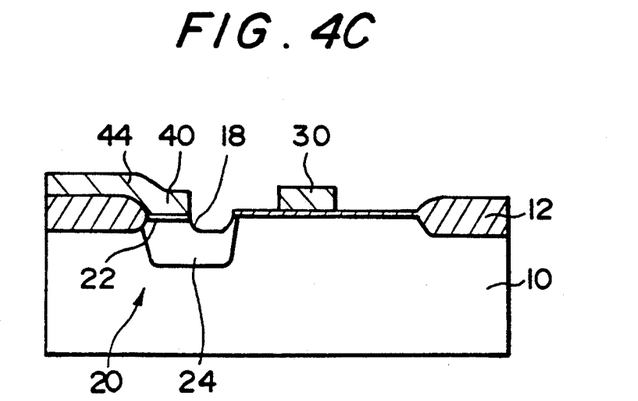

(C) In the step shown in FIG. 4C, the polycrystalline silicon layer 16 is etched by the usual photolithography and etching technology to form an $n^+$-type gate electrode 30, an $n^+$-type source/drain electrode 40 and a wiring portion 44 contiguous thereto. At that time, the exposed portion of the p-type silicon substrate 10 also is etched to form a hollow 18 on the substrate 10.

Figure 4D:
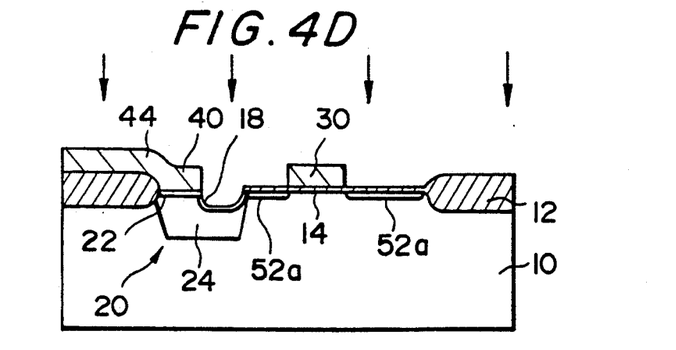

(D) In the step shown in FIG. 4D, under such a condition that energy of implantation is 50 to 100 KeV and an amount of implantation is $1 \times 10^{13}$ to $3 \times 10^{13}$ cm$^{-2}$, ion implantation (indicated by arrows in the drawing) of phosphorous or arsenic is performed in order to form an $n^-$-type offset region of an LDD structure. In this step, a diffused region 52a is formed on the surface of the silicon substrate 10.

Figure 4E:
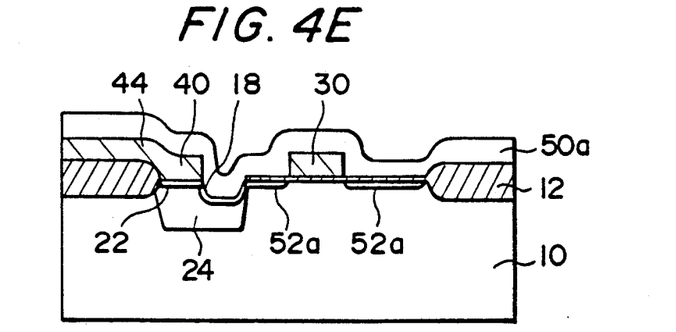

(E) In the step shown in FIG. 4E, a silicon oxide film 50a having a thickness of about 3,000 to 7,000 Angstrom is piled up by chemical vapor deposition (CVD).

Figure 4F:
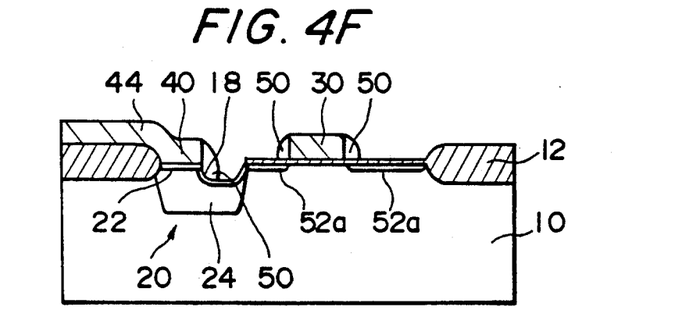

(F) In the step shown in FIG. 4F, the silicon oxide film 50a is etched by anisotropic etching. In this step, a side wall 50 in the form of a silicon oxide film is formed on the end of each of the gate electrode 30 and the source/drain electrode 40.

Figure 4G:
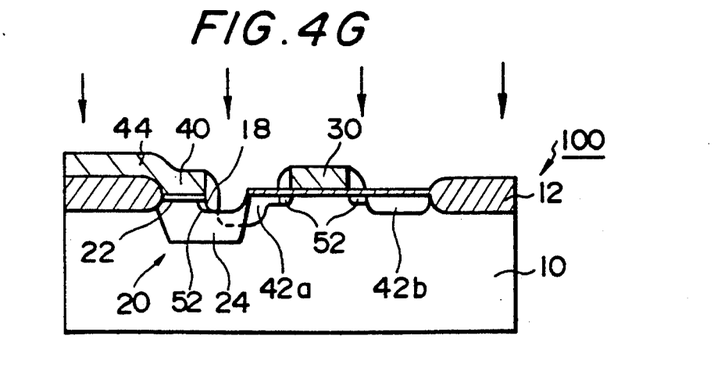

(G) In the step shown in FIG. 4G, under such a condition that energy of implantation is 50 to 100 KeV and an amount of implantation is $1 \times 10^{15}$ to $5 \times 10^{15}$ cm$^{-2}$, ion implantation (indicated by arrows in the drawing) of phosphorous or arsenic is performed, and annealing is performed in the atmosphere of nitrogen at 900° to 1,000° C. for 20 to 60 minutes. In this step, the n$^+$-type source diffused region 42a and the n$^+$-type drain diffused region 42b are formed. Under the side wall 50, an n$^-$-type offset region 52 constituted by a part of the diffused region 52a is formed to provide an LDD structure.

By the foregoing series of steps, it is possible to obtain the MOSFET shown in FIG. 1.

Figure 3:
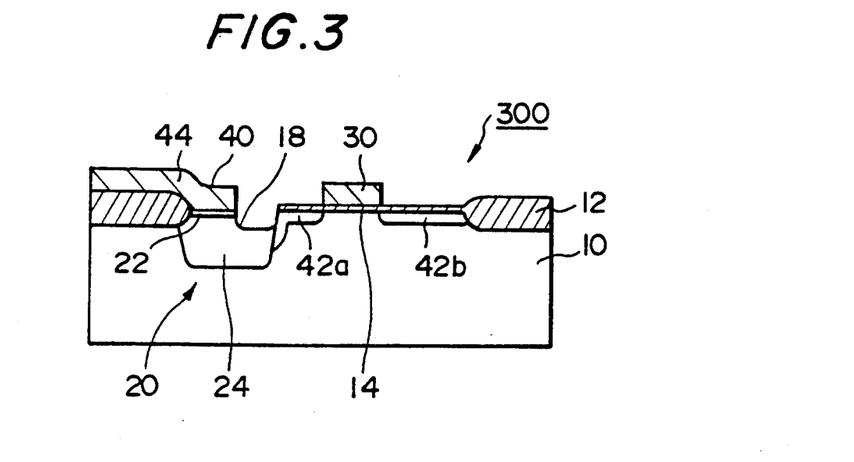
FIG. 3 is a cross-sectional view similar to FIG. 1, showing a modification according to a first embodiment.

Another MOSFET 300 according to the first embodiment, as shown in FIG. 3, can have a buried contact structure to which no LDD structure is added.

This MOSFET 300 is essentially identical in structure with the LDD-type MOSFET 100 of FIG. 1, except that there is no region corresponding to the n$^-$-type offset region 52 of the MOSFET 100.

EMBODIMENT 2

Figure 5:
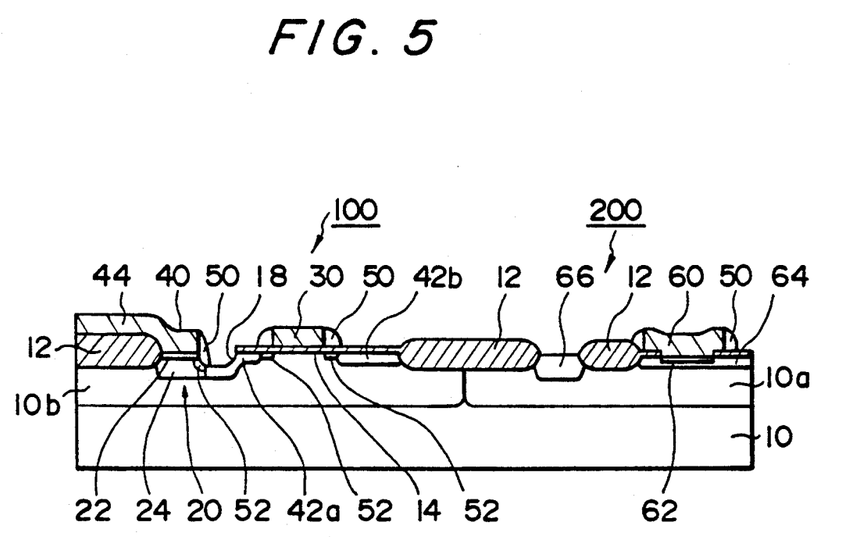
FIG. 5 is a cross-sectional view schematically showing a Bi-MOS-type semiconductor device according to a second embodiment.

FIG. 5 shows a semiconductor device according to a second embodiment of the present invention.

In FIG. 5, a Bi-MOS element includes an n-p-n-type vertical bipolar transistor 200 of washed emitter structure formed in an n-type well 10a on a p-type silicon substrate 10, and an n-channel MOSFET 100 of the LDD structure formed in a p-type well 10b.

MOSFET 100 of this embodiment is identical in construction with the MOSFET 100 of the first embodiment. Therefore, like reference numerals designate similar parts or elements throughout FIGS. 1 and 5; its detailed description is omitted here for clarity.

The bipolar transistor 200 includes an n$^+$-type emitter diffused region 62 formed in the n-type well 10a, a p-type base diffused region 64 formed under the n$^+$-type emitter diffused region 62, and an n$^+$-type collector diffused region 66 located on the p-type base diffused region 64 via a field oxide film 12. An emitter electrode 60 is formed on the n$^+$-type emitter diffused region 62.

The n$^+$-type emitter electrode 60 of the bipolar transistor 200, the n$^+$-type gate electrode 30 of MOSFET 100, a source/drain electrode 40 and a wiring portion 44 connected to a buried contact region 20 are formed of the n$^+$-type polycrystalline silicon layer having arsenic by the same layer forming process.

A first n$^+$-type contact diffused region 22 of buried contact structure 20 of MOSFET 100 and the n$^+$-type emitter diffused region 62 of the bipolar transistor 200 are simultaneously formed by impurity diffusion of arsenic from the n$^+$-type polycrystalline silicon layers (40, 60), having substantially the same depth of diffusion and impurity concentration. A second n$^+$-type contact diffused region 24 of the buried contact structure 20 of MOSFET 100 and the n$^+$-type collector diffused region 66 for connecting the collector electrode of the bipolar transistor 200 are simultaneously formed by impurity diffusion of phosphorous, having substantially the same depth of diffusion and impurity concentration.

In this embodiment, the first n$^+$-type contact diffused region 22 of MOSFET 100 has a depth of diffusion of 0.1 to 0.3 μm, and the second n$^+$-type contact diffused region 24 has a depth of diffusion of 0.5 to 0.8 μm.

According to this embodiment, since the buried contact structure 20 of MOSFET 100 includes the first n$^+$-type contact diffused region 22 formed by impurity diffusion and the second n$^+$-type contact diffused region 24 formed by impurity diffusion deeper than the first contact diffused region 22, it is possible to reduce the resistance of the buried contact structure. Therefore it is possible to form on one substrate both MOSFET 100 having a small parasitic resistance and the high-speed bipolar transistor 200 with shallow diffusion.

Since the second n$^+$-type contact diffused region 24 of the buried contact structure 20 is made deep, a buried contact structure having a low resistance can be formed with no influence by non-uniform processing, such as irregular depth of etching on the polycrystalline silicon layer as described in connection with the first embodiment.

It is possible to set the depth of diffusion and impurity concentration independently for the n$^+$-type emitter diffused region 62 of the bipolar transistor 200 and the second n$^+$-type contact diffused region 24 of MOSFET 100. Therefore, the characteristics of the buried contact structure 20 of MOSFET 100 can be independently set for the bipolar transistor 200, improving the degree of freedom of the design of the device.

FIGS. 6A through 6G show the manufacturing process of the semiconductor device of FIG. 5.

Figure 6A:
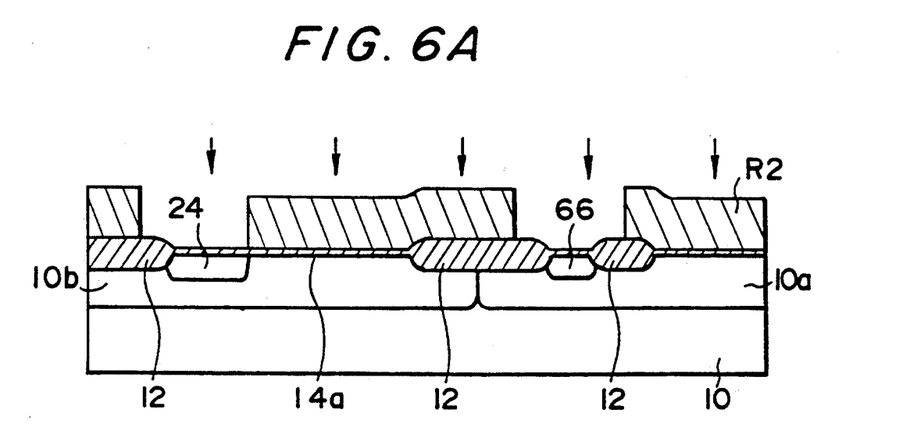
FIGS. 6A through 6G are cross-sectional views schematically showing the manufacturing process of the semiconductor device of FIG. 5.

(A) In the step shown in FIG. 6A, using the usual method, an n-type well 10a and a p-type well 10b are formed in the p-type silicon substrate 10, and a field oxide film 12 and an oxide silicon film 14a are formed on the silicon substrate 10. Then, under such a condition that energy of implantation is 80 to 120 KeV and an amount of implantation is $5 \times 10^{13}$ to $5 \times 10^{14}$ cm$^{-2}$, ion implantation (indicated by arrows in the drawing) of phosphorous are performed on the silicon substrate 10 via a resist film R2 as a mask having openings, and annealing is performed in the atmosphere of nitrogen at 900° to 1,000° C. for 40 to 80 minutes. In this step, an n$^+$-type collector diffused region 66 for connecting the collector electrode, and a second n$^+$-type contact diffused region 24 are formed.

Figure 6B:
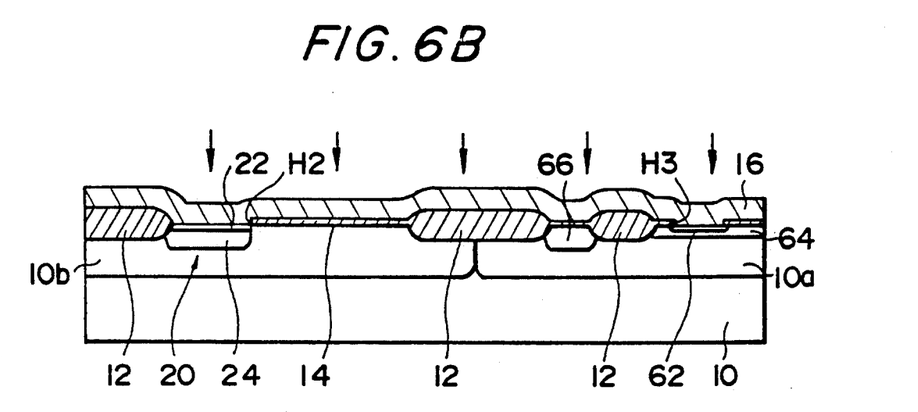

(B) In the step of FIG. 6B, ion implantation of a p-type impurity such as boron is performed to form a base diffused region 64, whereupon a resist film R2 is removed. Then, the oxide silicon film 14a shown in FIG. 6A is formed with openings H2, H3 for forming a buried contact structure and an emitter diffused region, respectively. A polycrystalline silicon layer 16 is deposited on the substrate 10 to a thickness of about 2,000 to 5,000 Angstrom by CVD. Under such a condition that energy of implantation is 60 to 100 KeV and an amount of implantation is $5 \times 10^{15}$ to $1 \times 10^{16}$ cm$^{-2}$, ion implantation (indicated by arrows in the drawing) of arsenic is performed, and annealing is performed in the atmosphere of nitrogen at 900° to 1,000° C. for 20 to 30 minutes. In this step, an n$^+$-type emitter diffused region 62 and a first n$^+$-type contact diffused region 22 are formed by arsenic diffusion from a polycrystalline silicon layer 16.

Figure 6C:
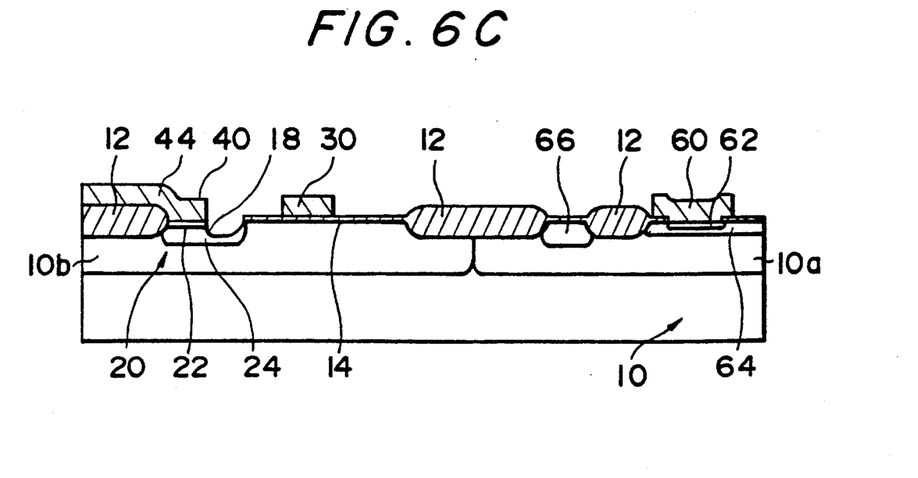

(C) In the step shown in FIG. 6C, the polycrystalline silicon layer 16 is photo-etched to form an n$^+$-type emitter electrode 60, an n+-type gate electrode 30, an n+-type source/drain electrode 40 to be connected to the buried contact structure, and a wiring portion 44. At this time, an exposed portion of the p-type silicon substrate 10 is also etched to form a hollow 18 on the substrate 10.

Figure 6D:
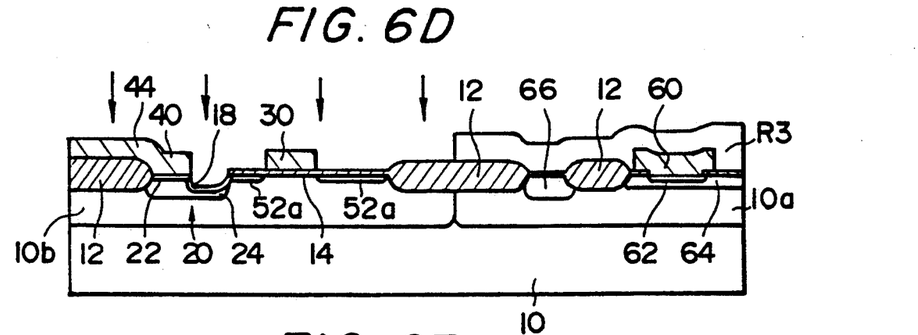

(D) In the step shown in FIG. 6D, a resist film R3 is formed on a bipolar transistor forming region. Then, under such a condition that energy of implantation is 50 to 100 KeV and an amount of implantation is $1 \times 10^{13}$ to $3 \times 10^{13}$ cm$^{-3}$, ion implantation (indicated by arrows in the drawing) of arsenic or phosphorous is performed to form an offset region for the LDD structure on a MOSFET forming region. In this step, an n$^-$-type diffused region 52a is formed in the MOSFET forming region on the surface of the substrate 10.

Figure 6E:
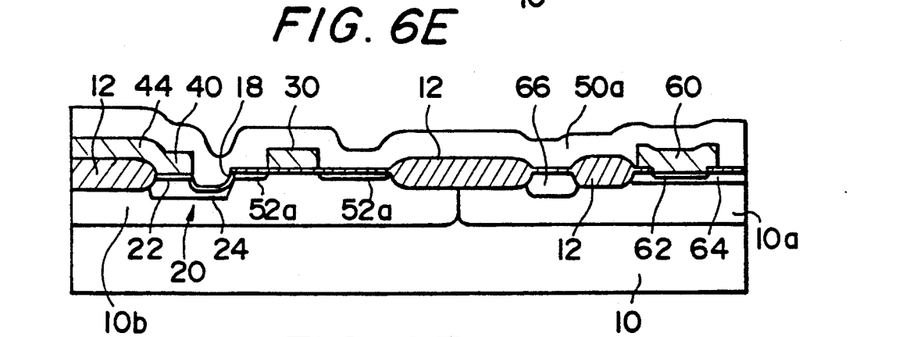

(E) In the step shown in FIG. 6E, after removing the resist film R3, a silicon oxide film 50a having a thickness of 3,000 to 7,000 Angstrom is piled up by CVD.

Figure 6F:
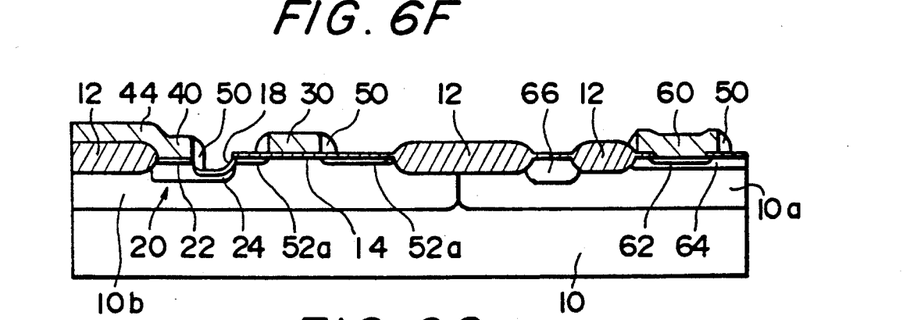

(F) In the step shown in FIG. 6F, the oxide silicon film 50a undergoes the anisotropic etching to form silicon oxide side walls 50 on the end of each of the gate electrode 30 and n+-type source/drain electrode 40 and on the opposite ends of the n+-type emitter electrode 60.

Figure 6G:
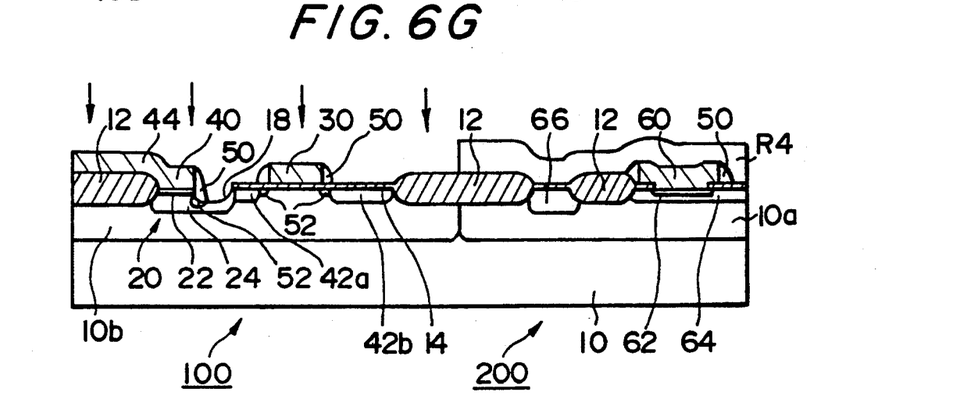

(G) In the step shown in FIG. 6G, a resist film R4 is formed on a bipolar transistor forming region. Then, under such a condition that energy of implantation is 50 to 100 KeV and an amount of implantation is $1 \times 10^{15}$ to $5 \times 10^{15}$ cm$^{-2}$, ion implantation (indicated by arrows in the drawing) of arsenic or phosphorous is performed, and annealing is performed in the atmosphere of nitrogen at 900° to 1,000° C. for 20 to 60 minutes. In this step, an n+-type source diffused region 42a and an n+-type drain diffused region 42b are formed for MOSFET 100. The offset region 52 constituted by part of the n$^-$-type diffused region 52a is formed under the side wall 50 to provide an LDD structure.

In the second embodiment, like the first embodiment, it is also possible to obtain a buried contact structure in a MOSFET to which no LDD structure is added.

Both the n+-type emitter diffused region 62 and the first n+-type contact diffused region 22 can be formed by the same first step, and the n+-type collector diffused region 66 and the second contact diffused region 24 are formed by the same second step, thus simplifying the manufacturing process of a semiconductor device.

EMBODIMENT 3

Figure 7:
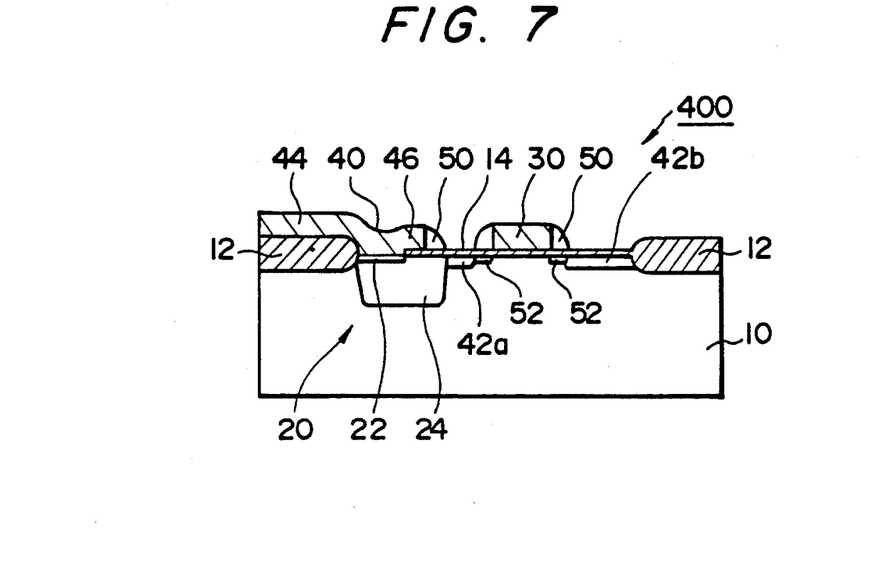
FIG. 7 is a cross-sectional view schematically showing a MOS-type semiconductor device according to a third embodiment.

FIG. 7 shows a modification of the MOSFET of the first embodiment.

MOSFET 400 of this embodiment is essentially identical in construction with the MOSFET 100 of FIG. 1, except that there is a cover portion 46. The cover portion 46 is formed by extending the end of the source/-drain electrode 40 of the polycrystalline silicon layer, covering the gate oxide film 14.

The cover portion 46 prevents the silicon layer of the first embodiment from being formed with a hollow 18, since the silicon substrate 10 is not exposed during etching. Therefore, no leak current is caused on the diffused layer due to the hollow 18.

For this purpose, a masking film is formed on the silicon layer 16 at a cover portion forming region during etching (FIG. 4C).

Figure 8:
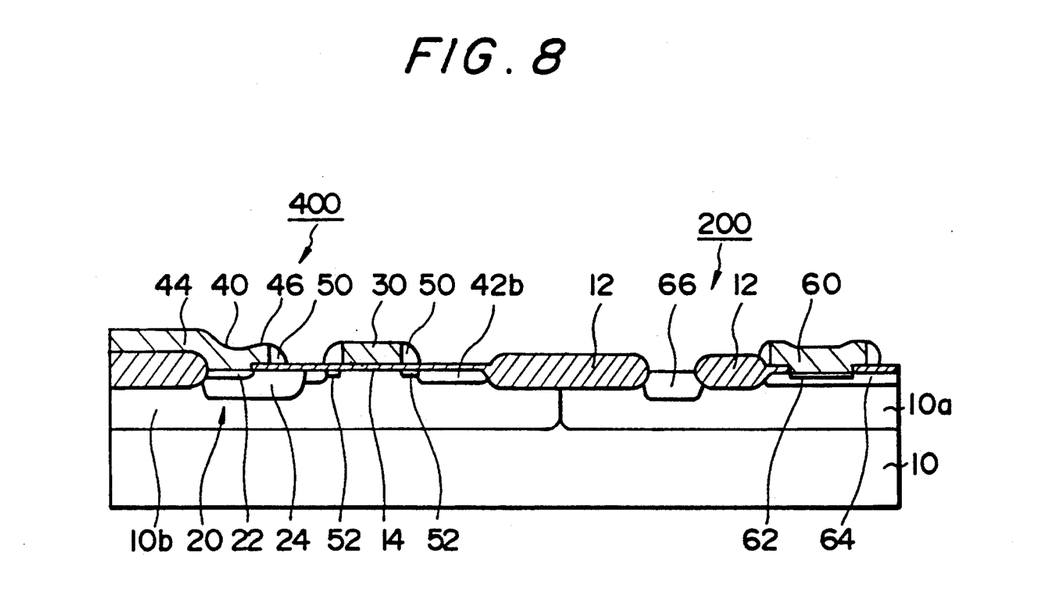
FIG. 8 is a cross-sectional view schematically showing a Bi-MOS-type semiconductor device according to the third embodiment.

FIG. 8 shows a Bi-MOS element similar to the Bi-MOS element of the second embodiment, to which the structure of MOSFET 400 is used. The Bi-MOS element of this embodiment is identical with that of FIG. 5, except that the cover portion 46 is formed.

In addition to the above-identified advantages as attained by the first and second embodiments, MOSFET and Bi-MOS elements of this embodiment can offer an advantage that the cover portion 46 serves to assist in preventing the leak current in the diffused layer which leak current might be caused by etching. Therefore, it is possible not only to prevent the leak current in the buried contact structure but also to prevent the subthreshold characterics of MOSFET from being deteriorated.

Although certain preferred embodiments have been shown and described, it should be understood that many changes and modifications may be made therein without departing from the scope of the appended claims. For example, this invention is also applicable to p-n-p bipolar elements and/or p-channel MOS elements as well as the n-channel MOSFET as a MOS element and n-p-n bipolar transistor as the bipolar element.

What is claimed is:

1. A semiconductor device comprising:
   (a) a semiconductor substrate;
   (b) an MOS element formed on a main surface of said semiconductor substrate, and having a buried contact structure; and
   (c) said buried contact structure including a first contact diffused region formed in said main surface of said semiconductor substrate by diffusion from a polycrystalline silicon layer, and a second contact diffused region formed by diffusion, said second contact diffused region being located deeper in said semiconductor substrate than said first contact diffused region such that said first contact diffused region overlays at least a portion of said second contact diffused region;
   wherein said first contact diffused region has a depth of diffusion of 0.1 to 0.3 μm and said second contact diffused region has a depth of diffusion of 0.5 to 0.8 μm, and
   wherein said MOS element comprises a source/drain diffused region, said depth of diffusion of said second contact diffused region being larger than a depth of said source/drain diffused region of said MOS element.

2. A semiconductor device according to claim 1, wherein said MOS element is an n-channel MOS transistor.

3. A semiconductor device according to claim 1, wherein said MOS element is a p-channel MOS transistor.

4. A semiconductor device according to claim 1, wherein said polycrystalline silicon layer defines a source/drain electrode.

5. A semiconductor device according to claim 4, wherein said polycrystalline silicon layer also defines a gate electrode.

6. A semiconductor device according to claim 1, wherein said first contact diffused region is doped with arsenic having a small diffusion constant and said second contact diffused region is doped with phosphorous having a large diffusion constant.

7. A semiconductor device according to claim 1, wherein a portion of said polycrystalline silicon layer to be connected to said buried contact structure has a cover portion extending over a gate oxide film of said MOS element so as to cover a gap between said gate oxide film and said polycrystalline silicon layer.

8. A semiconductor device according to claim 1, wherein offset regions are located in both a connecting portion between a gate electrode and a source/drain diffused region and a connecting portion between said first and second diffused regions of said buried contact structure so as to provide an LDD structure.

9. A method of manufacturing a semiconductor device, comprising the steps of:
(a) forming a lower contact diffused region in a silicon substrate by forming a field oxide film and a gate oxide film on said silicon substrate and doping said silicon substrate with an impurity of a large diffusion constant to form a buried contact structure forming region in said silicon substrate;
(b) forming an upper contact diffused region in said silicon substrate over said lower contact diffused region by forming openings in the gate oxide film, forming a polycrystalline silicon layer on the silicon substrate over said lower contact diffused region and doping said silicon substrate with an impurity of a small diffusion constant into the buried contact structure forming region via the openings such that said upper contact diffused region overlays at least a portion of said lower contact diffused region;
(c) etching the polycrystalline silicon layer thereby forming a gate electrode and a source/drain electrode; and
(d) doping said silicon substrate with an impurity between said gate electrode and said source/drain electrode thereby forming a source/drain diffused region in said silicon substrate.

10. A method according to claim 9, wherein the impurity to be used in the step (a) is phosphorous and the impurity to be used in the step (b) is arsenic.

11. A semiconductor device comprising:
(a) a semiconductor substrate;
(b) a bipolar element formed on a main surface of said semiconductor substrate;
(c) an MOS element formed on the main surface of said semiconductor substrate and having a buried contact structure;
(d) an emitter electrode of said bipolar element and a source/drain electrode of said MOS element being in the form of a single polycrystalline silicon layer;
(e) said buried contact structure of said MOS element including a first contact diffused region formed in said main surface of said semiconductor substrate by impurity diffusion of a first material from said polycrystalline silicon layer and a second contact diffused region formed by previous impurity diffusion of a second material, said second contact diffused region being located deeper in said semiconductor substrate than said first contact diffused region such that said first contact diffused region overlays at least a portion of said second contact diffused region; and
(f) an emitter diffused region of said bipolar element and said first contact diffused region being formed in said main surface of said semiconductor substrate by impurity diffusion from said polycrystalline silicon layer;
wherein said first contact diffused region has a depth of diffusion of 0.1 to 0.3 $\mu$m and said second contact diffused region has a depth of diffusion of 0.5 to 0.8 $\mu$m, and
wherein said MOS element comprises a source/drain diffused region, said depth of diffusion of said second contact diffused region being larger than a depth of said source/drain diffused region of said MOS element.

12. A semiconductor device according to claim 11, wherein said semiconductor substrate is a silicon substrate, said MOS element is a MOS transistor formed in a first well, and said bipolar element is a bipolar transistor formed in a second well.

13. A semiconductor device according to claim 11, wherein said second contact diffused region of said MOS element and a collector diffused region of said bipolar element are formed in a single doping step.

14. A semiconductor device according to claim 11, wherein said first contact diffused region is doped with arsenic having a small diffusion constant and said second constant diffused region is doped with phosphorous having a large diffusion constant.

15. A semiconductor device according to claim 11, wherein a portion of said polycrystalline silicon layer to be connected to said buried contact structure has a cover portion extending over a gate oxide film of said MOS element so as to cover a gap between said gate oxide film and said polycrystalline silicon layer.

16. A semiconductor device according to claim 11, wherein offset regions are located in both a connecting portion between a gate electrode and a source/drain diffused region and a connecting portion between said first and second diffused regions of said buried contact structure so as to provide an LDD structure.

17. A method of manufacturing a semiconductor device having a MOS element and a bipolar element on a silicon substrate, the method comprising the steps of:
(a) forming a well on said silicon substrate;
(b) forming a field oxide film and a gate oxide film on said well;
(c) forming a lower contact diffused region of said MOS element and a collector diffused region of said bipolar element in said well by doping said well with an impurity of a large diffusion constant, said lower contact diffused region being part of a buried contact structure forming region of said MOS element;
(d) forming an upper contact diffused region of said MOS element over said lower contact diffused region and an emitter diffused region of said bipolar element spaced from said collector diffused region by masking said MOS element, doping said well with an impurity thereby forming a base diffused region of said bipolar element, forming openings in said gate oxide film over said buried contact structure forming region and said base diffused region, forming a polycrystalline silicon layer on said silicon substrate over said lower contact diffused region and said base diffused region, and doping said well with an impurity of a small diffusion constant through said openings in said gate oxide film to form said upper contact diffused region over said lower contact diffused region and said emitter diffused region in said base diffused region such that said upper contact diffused region overlays at least a portion of said lower contact diffused region;
(e) forming a gate electrode and a source/drain electrode of said MOS element and an emitter electrode of said bipolar element by etching said polycrystalline layer; and
(f) forming a source/drain diffused region in said well by masking said bipolar element and doping said well with an impurity between said gate electrode and said source/drain electrode.

18. A method according to claim 17, wherein the impurity to be used in the step (c) is phosphorous and the impurity to be used in the step (d) is arsenic.

19. A semiconductor device comprising:
(a) a semiconductor substrate;
(b) an MOS element formed on a main surface of said semiconductor substrate and having a buried contact structure; and
(c) said buried contact structure including a first contact diffused region formed in said main surface of said semiconductor substrate by diffusion from a polycrystalline silicon layer, and a second contact diffused region formed by diffusion, said second contact diffused region being located deeper in said semiconductor substrate than said first contact diffused region such that said first contact diffused region overlays at least a portion of said second contact diffused region;
wherein said first contact diffused region has a depth of diffusion of 0.1 to 0.3 μm and said second contact diffused region has a depth of diffusion of 0.5 to 0.8 μm, and
wherein said MOS element comprises a source/drain diffused region, an impurity concentration in said first contact diffused region being no less than an impurity concentration in said source/drain diffused region of said MOS element.

20. A semiconductor device comprising:
(a) a semiconductor substrate;
(b) a bipolar element formed on a main surface of said semiconductor substrate;
(c) an MOS element formed on the main surface of said semiconductor substrate and having a buried contact structure;
(d) an emitter electrode of said bipolar element and a source/drain electrode of said MOS element being in the form of a single polycrystalline silicon layer;
(e) said buried contact structure of said MOS element including a first contact diffused region formed in said main surface of said semiconductor substrate by impurity diffusion of a first material from said polycrystalline silicon layer and a second contact diffused region formed by previous impurity diffusion of a second material, said second contact diffused region being located deeper in said semiconductor substrate than said first contact diffused region such that said first contact diffused region overlays at least a portion of said second contact diffused region; and
(f) an emitter diffused region of said bipolar element and said first contact diffused region being formed in said main surface of said semiconductor substrate by impurity diffusion from said polycrystalline silicon layer;
wherein said first contact diffused region has a depth of diffusion of 0.1 to 0.3 μm and said second contact diffused region has a depth of diffusion of 0.5 to 0.8 μm, and
wherein said MOS element comprises a source/drain diffused region, an impurity concentration in said first contact defused region being no less than an impurity concentration in said source/drain diffused region of said MOS element.

* * * * *